United States Patent
Ueta et al.

(10) Patent No.: US 12,216,166 B2
(45) Date of Patent: Feb. 4, 2025

(54) DIAGNOSTIC APPARATUS, DIAGNOSTIC METHOD, RECORDING MEDIUM HAVING RECORDED THEREON DIAGNOSTIC PROGRAM, AND POWER CONVERSION APPARATUS INCLUDING DIAGNOSTIC APPARATUS

(71) Applicant: FUJI ELECTRIC CO., LTD., Kanagawa (JP)

(72) Inventors: Hiroaki Ueta, Hino (JP); Hiroyuki Kokubun, Hino (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 221 days.

(21) Appl. No.: 17/728,931

(22) Filed: Apr. 25, 2022

(65) Prior Publication Data

US 2022/0381829 A1 Dec. 1, 2022

(30) Foreign Application Priority Data

Jun. 1, 2021 (JP) .................................. 2021-092549

(51) Int. Cl.
*G01R 31/34* (2020.01)
*H02H 7/085* (2006.01)
(Continued)

(52) U.S. Cl.
CPC .......... *G01R 31/343* (2013.01); *H02H 7/085* (2013.01); *H02P 29/024* (2013.01); *H02M 1/32* (2013.01)

(58) Field of Classification Search
CPC ...... G01R 31/343; G01R 23/02; G01R 31/34; H02H 7/085; H02H 7/0833; H02P 29/024;
(Continued)

(56) References Cited

U.S. PATENT DOCUMENTS

2014/0042939 A1* 2/2014 Kobayashi ............. H02P 27/08
318/400.3
2016/0097814 A1* 4/2016 Kuruppu ............. H02P 29/0241
324/522

(Continued)

FOREIGN PATENT DOCUMENTS

EP         3910783 A1    11/2021
JP      2013042614 A     2/2013
(Continued)

OTHER PUBLICATIONS

Office Action issued for counterpart Japanese Application No. 2021-092549, issued by the Japanese Patent Office on Aug. 31, 2021 (drafted on Aug. 25, 2021).
(Continued)

*Primary Examiner* — Alvaro E Fortich

(57) ABSTRACT

There is provided a diagnostic apparatus including: a data acquisition unit configured to acquire target data relating to a current value between a power conversion apparatus and a motor; a detection unit configured to detect a peak value in a time series waveform of the target data; a counting operation unit configured to use a frequency counting method to calculate an amplitude of the peak value and a frequency of occurrence of the amplitude; and a diagnostic unit configured to diagnose an abnormality of the motor based on the amplitude and the frequency of occurrence. The diagnostic unit diagnoses that the motor is abnormal when a statistic which is calculated from the amplitude and the frequency of occurrence of the amplitude does not satisfy a predetermined reference.

19 Claims, 8 Drawing Sheets

(51) Int. Cl.
*H02P 29/024* (2016.01)
*H02M 1/32* (2007.01)

(58) Field of Classification Search
CPC ........ H02M 1/32; H02M 7/06; H02M 7/5387;
H02M 7/5395
See application file for complete search history.

(56) References Cited

U.S. PATENT DOCUMENTS

2019/0310322 A1* 10/2019 Tani .................. G01R 31/40
2020/0191833 A1* 6/2020 Kato .................. G01R 15/16
2020/0400754 A1* 12/2020 Hotta ................. H02M 1/32

FOREIGN PATENT DOCUMENTS

| JP | 2014018075 A | 1/2014 |
| JP | 2020065386 A | 4/2020 |
| JP | 2020114084 A | 7/2020 |
| WO | 2014156386 A1 | 10/2014 |

OTHER PUBLICATIONS

Office Action issued for counterpart Japanese Application No. 2021-092549, issued by the Japanese Patent Office on Dec. 14, 2021 (drafted on Dec. 6, 2021).
Office Action issued for counterpart Japanese Application No. 2021-092549, issued by the Japanese Patent Office on Mar. 15, 2022 (drafted on Mar. 7, 2022).

* cited by examiner

DIAGNOSTIC APPARATUS, DIAGNOSTIC METHOD, RECORDING MEDIUM HAVING RECORDED THEREON DIAGNOSTIC PROGRAM, AND POWER CONVERSION APPARATUS INCLUDING DIAGNOSTIC APPARATUS

The contents of the following Japanese patent application(s) are incorporated herein by reference:
NO. 2021-092549 filed in JP on Jun. 1, 2021

BACKGROUND

1. Technical Field

The present invention relates to a diagnostic apparatus, a diagnostic method, a recording medium having recorded thereon a diagnostic program, and a power conversion apparatus including the diagnostic apparatus.

2. Related Art

Patent Document 1 discloses that "a power conversion apparatus, which is capable of detecting a sign of a failure at a low cost and at an early stage, is provided".

CITATION LIST

Patent Document

Patent Document 1: Japanese Patent Application Publication No. 2020-114084
Patent Document 2: Japanese Domestic re-publication of PCT international application 2014-156386

SUMMARY

A first aspect of the present invention provides a diagnostic apparatus. The diagnostic apparatus may include a data acquisition unit configured to acquire target data relating to a current value between a power conversion apparatus and a motor. The diagnostic apparatus may include a detection unit configured to detect a peak value in a time series waveform of the target data. The diagnostic apparatus may include a counting operation unit configured to use a frequency counting method to calculate an amplitude of the peak value and a frequency of occurrence of the amplitude. The diagnostic apparatus may include a diagnostic unit configured to diagnose an abnormality of the motor based on the amplitude and the frequency of occurrence.

The diagnostic unit may diagnose that the motor is abnormal when a statistic which is calculated from the amplitude and the frequency of occurrence of the amplitude does not satisfy a predetermined reference.

The diagnostic unit may diagnose that the motor is abnormal when a magnitude of a change in a statistic which is calculated from the amplitude and the frequency of occurrence of the amplitude does not satisfy a predetermined reference.

The diagnostic apparatus may further include a reference setting unit configured to set the reference based on the amplitude and the frequency of occurrence which are calculated for a predetermined period.

The diagnostic apparatus may further include a notification unit configured to provide a notification of the abnormality when the motor is diagnosed to be abnormal.

The diagnostic apparatus may further include a transformation unit configured to perform a coordinate transformation of the target data. The detection unit may detect the peak value in the time series waveform of the target data of which the coordinate transformation is performed.

The coordinate transformation may be a dq (direct-quadrature-zero) transformation.

The data acquisition unit may acquire, in addition to the current value, data relating to a voltage value between the power conversion apparatus and the motor, as the target data.

The data acquisition unit may acquire, in addition to the current value, data relating to a rotation speed of the motor, as the target data.

A second aspect of the present invention provides a power conversion apparatus. The power conversion apparatus may include the diagnostic apparatus.

A third aspect of the present invention provides a diagnostic method. The diagnostic method may include acquiring target data relating to a current value between a power conversion apparatus and a motor. The diagnostic method may include detecting a peak value in a time series waveform of the target data. The diagnostic method may include using a frequency counting method to calculate an amplitude of the peak value and a frequency of occurrence of the amplitude. The diagnostic method may include diagnosing an abnormality of the motor based on the amplitude and the frequency of occurrence.

A fourth aspect of the present invention provides a recording medium having recorded thereon a diagnostic program. The diagnostic program may be executed by a computer. The diagnostic program may cause the computer to function as a data acquisition unit configured to acquire target data relating to a current value between a power conversion apparatus and a motor. The diagnostic program may cause the computer to function as a detection unit configured to detect a peak value in a time series waveform of the target data. The diagnostic program may cause the computer to function as a counting operation unit configured to use a frequency counting method to calculate an amplitude of the peak value and a frequency of occurrence of the amplitude. The diagnostic program may cause the computer to function as a diagnostic unit configured to diagnose an abnormality of the motor based on the amplitude and the frequency of occurrence.

The summary clause does not necessarily describe all necessary features of the embodiments of the present invention. The present invention may also be a sub-combination of the features described above.

DESCRIPTION OF EXEMPLARY EMBODIMENTS

Hereinafter, the invention will be described through embodiments of the invention, but the following embodiments do not limit the invention according to claims. Further, not all the combinations of features described in the embodiments are essential for means to solve the problem in the invention.

Figure 1:
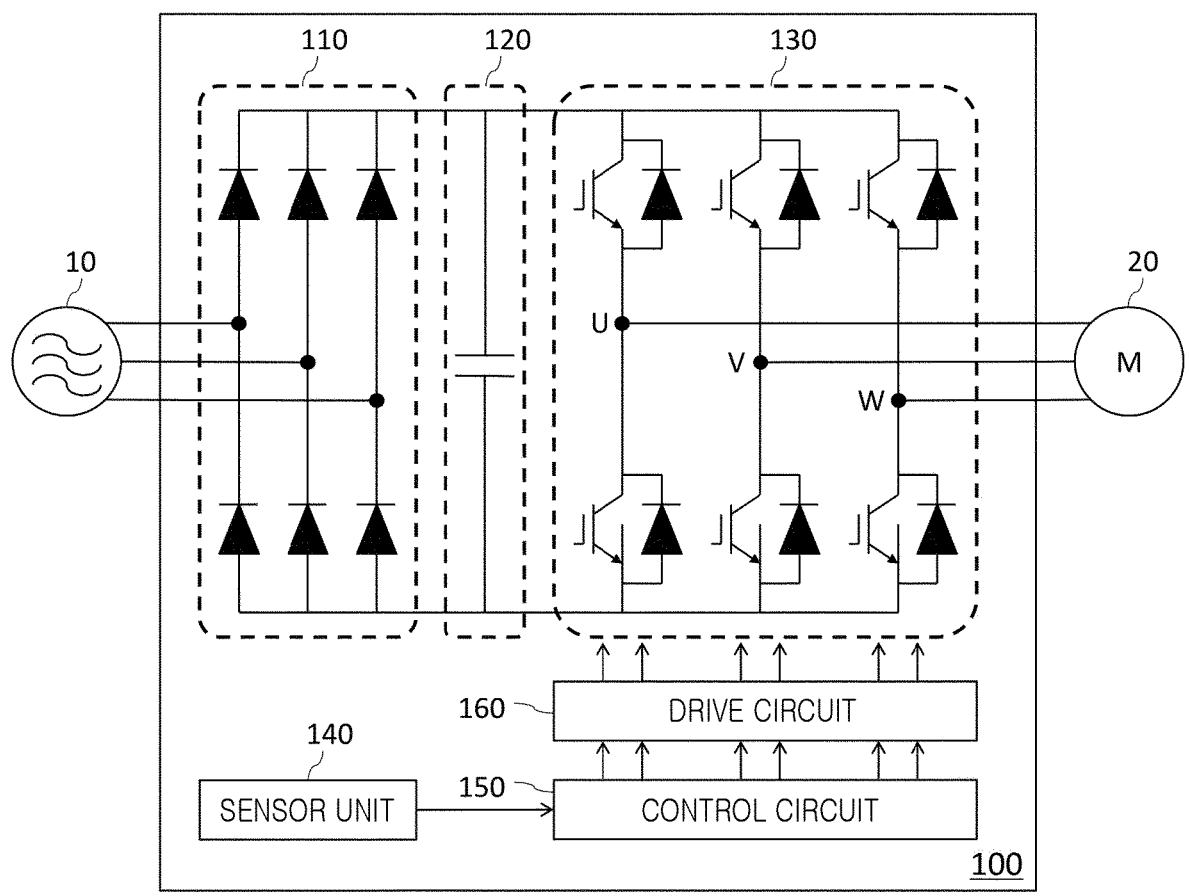
FIG. 1 shows an example of a power conversion apparatus 100 together with a power supply 10 and a motor 20.

FIG. 1 shows an example of a power conversion apparatus 100 together with a power supply 10 and a motor 20. In a power conversion system, the motor 20 is controlled by converting electric power supplied from the power supply 10 by the power conversion apparatus 100 and supplying the converted electric power to the motor 20.

The power supply 10 is a source that supplies the electric power for controlling the motor 20. The power supply 10 may be, for example, a 200 V three-phase AC power supply. The power supply 10 supplies the electric power to the motor 20 via the power conversion apparatus 100.

The motor 20 is a device that converts electrical energy (electric power) into mechanical energy (power). The motor 20 may be, for example, a three-phase AC motor of a three-phase induction motor. The motor 20 converts, into the power, the electric power which is supplied from the power supply 10 and is converted by the power conversion apparatus 100.

The power conversion apparatus 100 converts the electric power obtained from the power supply 10 by controlling a voltage, a frequency, or the like to operate the motor 20 at a rotation speed and torque suitable for a purpose, and supplies the converted electric power to the motor 20. The power conversion apparatus 100 includes a rectifier circuit 110, a smoothing capacitor 120, an inverter circuit 130, a drive circuit 160, a sensor unit 140, and a control circuit 150.

In the rectifier circuit 110, six diodes are bridge-connected, and an AC output of the power supply 10 is rectified.

The smoothing capacitor 120 is connected between DC output terminals of the rectifier circuit 110, and smooths an output of the rectifier circuit 110.

The inverter circuit 130 is connected between the DC output terminals of the rectifier circuit 110, and converts the output of the rectifier circuit 110 to supply the converted output to the motor 20. The inverter circuit 130 may be, for example, an inverter circuit of a three-phase voltage control type, and converts a DC voltage output from the rectifier circuit 110 into a three-phase AC voltage and supplies the three-phase AC voltage to the motor 20 which is the three-phase AC motor. At this time, a speed of the motor 20 can be changed by changing an output frequency of the inverter circuit 130. Such an inverter circuit 130 is, for example, configured by a first arm circuit to a third arm circuit being connected in parallel. Each arm circuit includes two semiconductor switch elements consisting of transistors which are connected in series, and diodes respectively connected in antiparallel between emitters and collectors of the transistors that constitute these semiconductor switch elements. It should be noted that in the present drawing, a case where a semiconductor switch element is an IGBT (Insulated Gate Bipolar Transistor) is shown as an example. However, the present invention is not limited to this. As the semiconductor switch element, various switching elements such as a transistor and a MOS-FET may be used. Connection points of the two semiconductor switch elements in such respective arm circuits constitute a first output point U, a second output point V, and a third output point W, respectively. Further, end portions of excitation windings of the motor 20 consisting of the three-phase induction motor are respectively connected to the first output point U, the second output point V, and the third output point W.

The sensor unit 140 detects various physical quantities (a current, the voltage, a rotation speed, or the like). The sensor unit 140 supplies a detected physical quantity to the control circuit 150.

The control circuit 150 gives, to the drive circuit 160, a command signal necessary for controlling the motor 20 according to the various physical quantities supplied from the sensor unit 140.

The drive circuit 160 drives each gate of the transistor constituting the semiconductor switch element. The drive circuit 160 drives, for example, each gate of the transistor constituting the semiconductor switch element included in the inverter circuit 130 based on the command signal from the control circuit 150, for example, a PWM (Pulse Width Modulation) command signal.

In the motor 20 in such a power conversion system, a winding should be insulated with a coating (for example, enamel or the like); however, due to various reasons, an insulation resistance may become small to cause a short circuit. This is called a layer short. Such a layer short may occur, for example, due to a deterioration of an insulation film by heat (an overload, a motor lock, or the like), damage to a film in a manufacturing process of the motor, an insulation deterioration by a vibration, mixing of dust, a deterioration over time, and the like. Therefore, the diagnostic technology according to the present embodiment may be applied to, for example, an abnormality diagnosis of the motor 20 in such a power conversion system.

Figure 2:
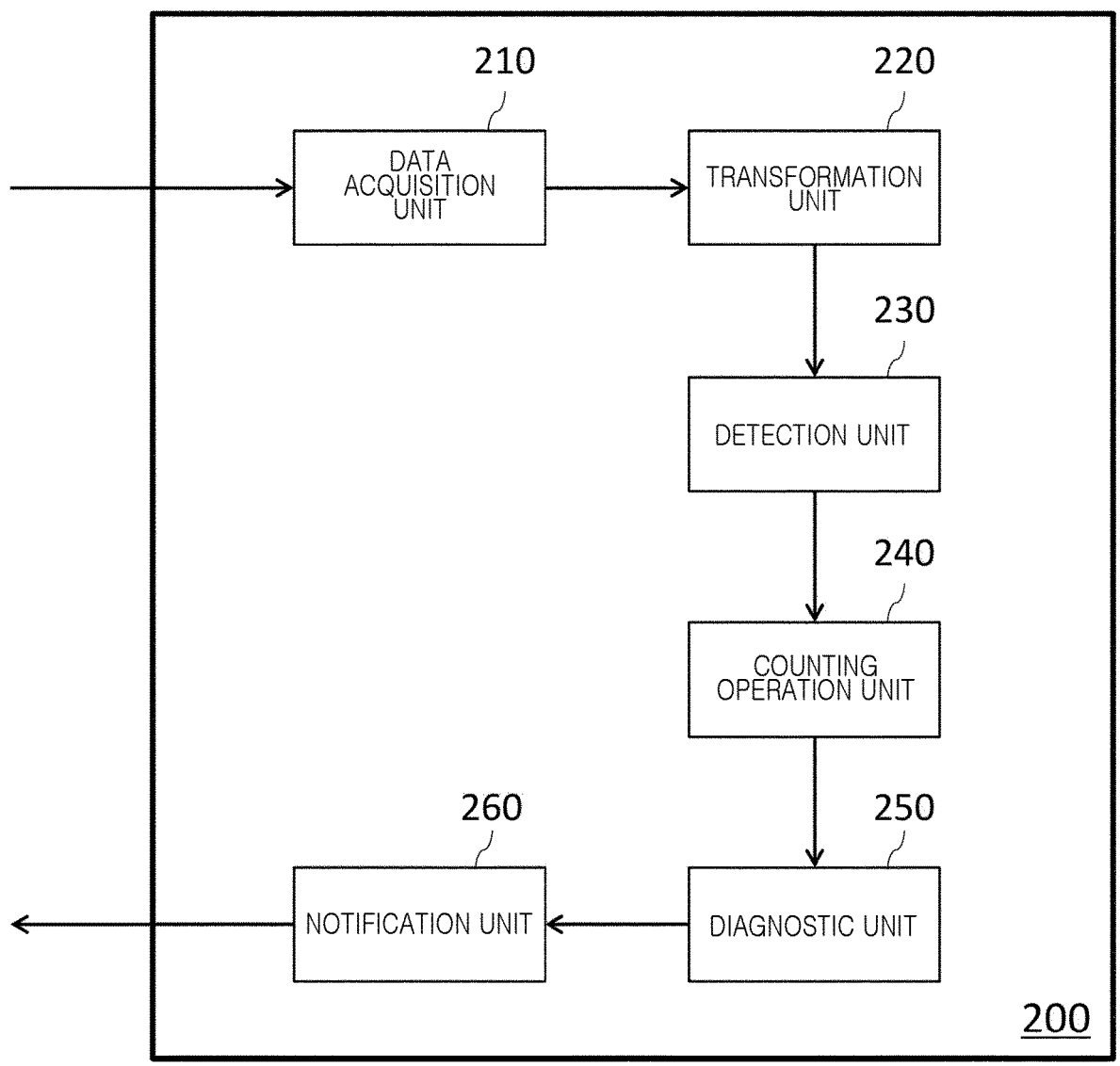
FIG. 2 shows an example of a block diagram of a diagnostic apparatus 200 according to the present embodiment.

FIG. 2 shows an example of a block diagram of a diagnostic apparatus 200 according to the present embodiment. The diagnostic apparatus 200 according to the present embodiment focuses on an amplitude of a current value between the power conversion apparatus 100 and the motor 20, and diagnoses an abnormality of the motor 20 by an analysis using a frequency counting method.

The diagnostic apparatus 200 may be a computer such as a PC (a personal computer), a tablet type computer, a smartphone, a workstation, a server computer, or a general-purpose computer, or may be a computer system in which a plurality of computers are connected. Such a computer system is also a computer in a broad sense. In addition, the diagnostic apparatus 200 may be implemented by one or more virtual computer environments that can be executed in the computer. Instead of this, the diagnostic apparatus 200 may be a dedicated computer designed to diagnose the motor, or may be dedicated hardware realized by dedicated circuitry. In addition, when the diagnostic apparatus 200 is able to be connected to the Internet, the diagnostic apparatus 200 may be realized by cloud computing.

The diagnostic apparatus 200 includes a data acquisition unit 210, a transformation unit 220, a detection unit 230, a counting operation unit 240, a diagnostic unit 250, and a notification unit 260. It should be noted that each of these blocks is a functional block that is functionally separated, and may not necessarily match an actual device configuration. That is, in the present drawing, even though each block is shown as a single block, each block may not be necessarily configured by a single device. In addition, in the present drawing, even though blocks are shown as separate blocks, the blocks may not be necessarily configured by separate devices.

The data acquisition unit 210 is configured to acquire target data relating to the current value between the power conversion apparatus 100 and the motor 20. For example, the data acquisition unit 210 may be a communication unit, and acquires the target data from the power conversion apparatus 100 via a network. However, the present invention is not limited to this. The data acquisition unit 210 may acquire the target data via an input by an operator, or may read and acquire the target data from various memory devices and the like. At this time, as an example, the data acquisition unit 210 may acquire, as the target data, each of digital values obtained by an AD converter digitally converting motor currents which are respectively supplied from the first output point U, the second output point V, and the third output point W to the excitation windings for three phases of the motor 20, and which are detected by a current sensor in the sensor unit 140. The data acquisition unit 210 supplies the acquired target data to the transformation unit 220.

The transformation unit 220 is configured to perform a coordinate transformation of the target data. Such a coordinate transformation may be, for example, a dq transformation. That is, for a motor current for the three phases supplied from the data acquisition unit 210, by rotating dq coordinates in synchronization with a rotating magnetic field and applying the dq transformation, the transformation unit 220 may be able to perform a frequency counting operation described below in a rotating coordinate system. However, the present invention is not limited to this. For the motor current for the three phases supplied from the data acquisition unit 210, by applying an $\alpha\beta$ transformation which is a transformation from a three-phase alternating current to an equivalent two-phase alternating current, the transformation unit 220 may be able to perform the frequency counting operation described below in a stationary coordinate system. In this way, the transformation unit 220 applies coordinate transformation such as the dq transformation or the $\alpha\beta$ transformation to the target data in order to simplify a subsequent analysis. The transformation unit 220 supplies the detection unit 230 with the target data of which the coordinate transformation is performed.

The detection unit 230 detects a peak value in a time series waveform of the target data (also referred to as a "peak value", an "extreme value", and a "peak and valley"). More specifically, the detection unit 230 is configured to detect the peak value in the time series waveform of the target data of which the coordinate transformation is performed by the transformation unit 220. The detection unit 230 supplies the detected peak value to the counting operation unit 240.

The counting operation unit 240 uses a frequency counting method (also referred to as a "waveform counting method" and a "cycle counting method") to calculate an amplitude of the peak value (a difference between a peak and a valley) and a frequency of occurrence of the amplitude (a cycle). For example, the counting operation unit 240 may use a rainflow method, particularly a three point cycle counting method, to calculate the amplitude of the peak value and the frequency of occurrence of the amplitude. This will be described below. However, the present invention is not limited to this. The counting operation unit 240 may use other frequency counting methods, such as a peak method, a range method, and a range pair method, to calculate the amplitude of the peak value and the frequency of occurrence of the amplitude. The counting operation unit 240 supplies the diagnostic unit 250 with the amplitude of the peak value and the frequency of occurrence of the amplitude which are calculated.

The diagnostic unit 250 is configured to diagnose the abnormality of the motor 20 based on the amplitude and the frequency of occurrence. For example, the diagnostic unit 250 diagnoses the abnormality of the motor 20 based on a statistic which is calculated from the amplitude and the frequency of occurrence of the amplitude which are supplied from the counting operation unit 240. The diagnostic unit 250 supplies a diagnostic result to the notification unit 260.

The notification unit 260 is configured to provide a notification of the abnormality when the motor 20 is diagnosed to be abnormal. For example, the notification unit 260 may provide the notification of the abnormality by displaying, on a monitor, a fact that the motor 20 is abnormal. However, the present invention is not limited to this. The notification unit 260 may provide the notification of the abnormality by outputting, by a voice, the fact that the motor 20 is abnormal, may provide the notification of the abnormality by printing out, or may provide the notification of the abnormality by transmitting a signal to another functional unit or another apparatus. For example, when the motor 20 is diagnosed to be abnormal, the notification unit 260 may transmit a signal, which indicates the fact that the motor 20 is abnormal, to the control circuit 150 of the power conversion apparatus 100. This makes it possible for the control circuit 150 to stop a control of the motor 20.

Figure 3:
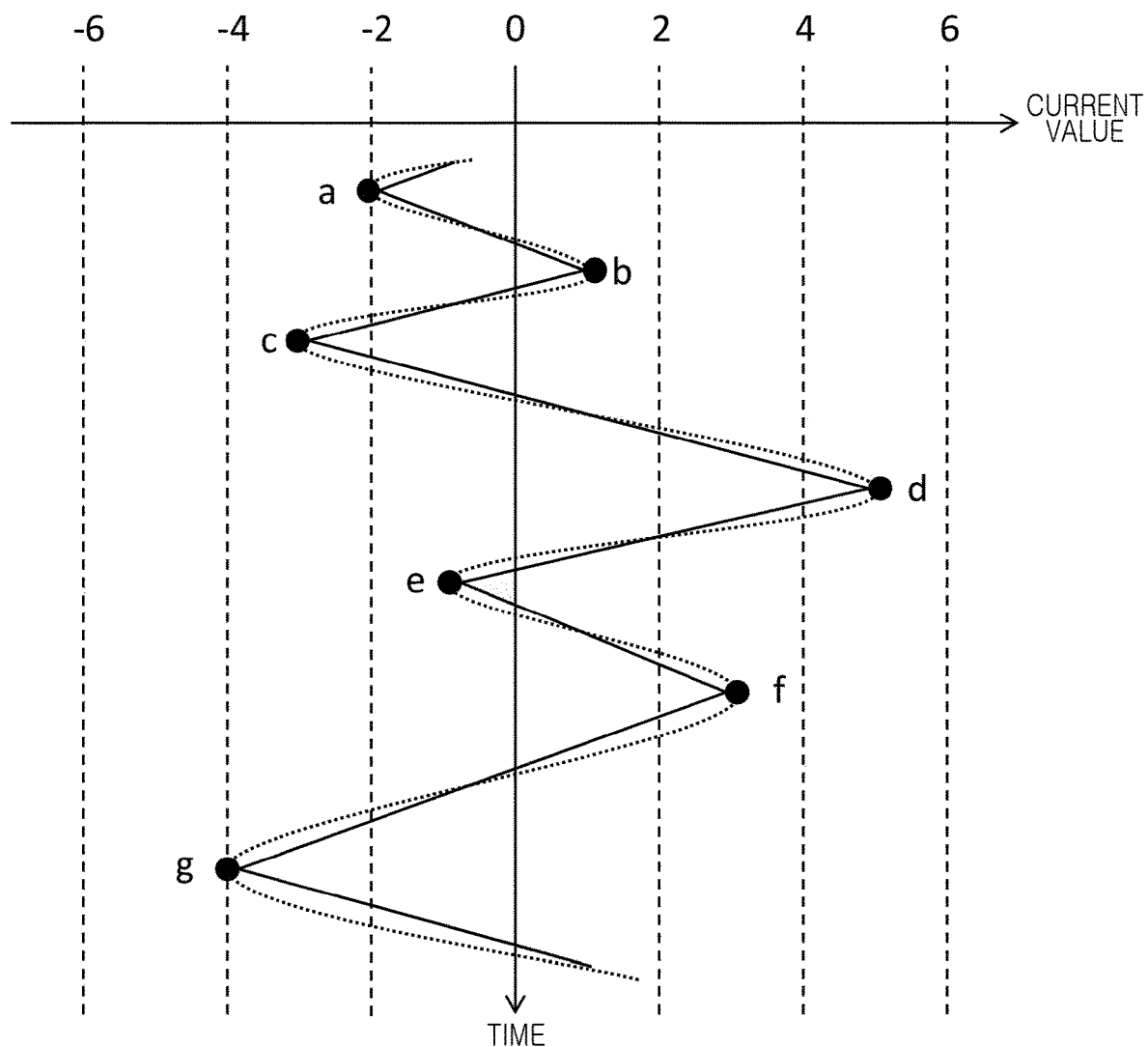
FIG. 3 shows an example of target data which is set as an analysis target by the diagnostic apparatus 200 according to the present embodiment, together with a detected peak value.

FIG. 3 shows an example of target data which is set as an analysis target by the diagnostic apparatus 200 according to the present embodiment, together with a detected peak value. In the present drawing, the horizontal axis represents the current value as the target data. In addition, in the present drawing, the vertical axis represents a time, and the time elapses from a top to a bottom. Further, in the present drawing, a dotted line indicates the time series waveform of the target data. In addition, in the present drawing, a point a to a point g, which are indicated by dots, indicate peak values detected from the time series waveform of the target data. In addition, in the present drawing, a solid line indicates a straight line connecting continuous peak values. The rainflow method is a method of regarding, as multiple roof structures, a plurality of straight lines which connect such continuous peak values, and of analyzing data that is a target in consideration of similarity to appearances of raindrops flowing down from a base of a roof.

The diagnostic apparatus 200 according to the present embodiment may use this rainflow method to calculate the amplitude of the peak value and the frequency of occurrence of the amplitude. For example, a counting method that presupposes a closed hysteresis loop, such as the range pair method, has a drawback that a range in which the closed hysteresis loop is not formed cannot be counted. In contrast with this, in the rainflow method, the range in which the closed hysteresis loop is not formed can be counted as 0.5 cycles (½ cycles). The diagnostic apparatus 200 according to the present embodiment uses the rainflow method, particularly the three point cycle counting method, to calculate the amplitude of the peak value and the frequency of occurrence of the amplitude. This will be briefly described.

Figure 4:
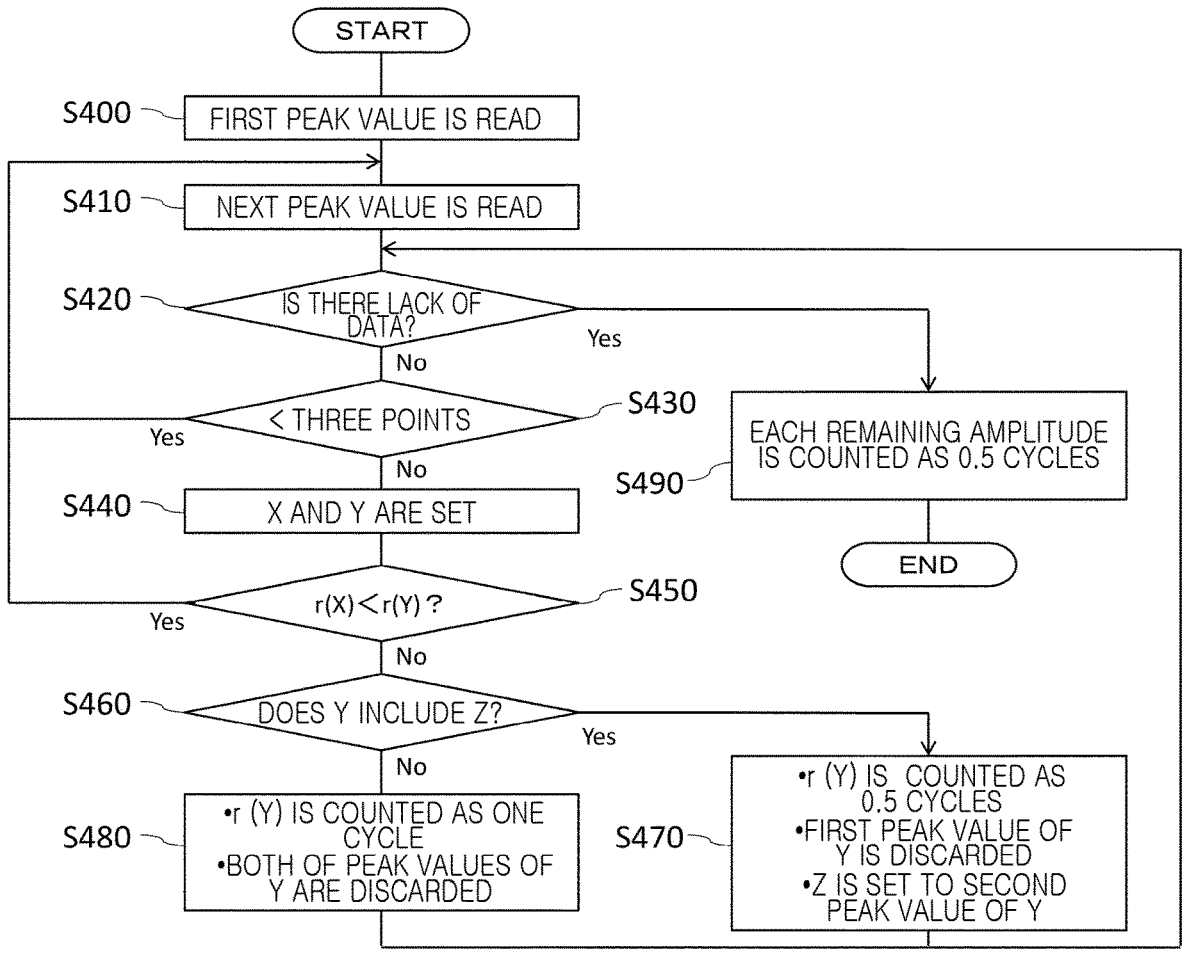
FIG. 4 shows an example of a flowchart of a three point cycle counting method which is used by the diagnostic apparatus 200 according to the present embodiment.

FIG. 4 shows an example of a flowchart of a three point cycle counting method which is used by the diagnostic apparatus 200 according to the present embodiment. In the three point cycle counting method, the computer counts the cycle in consideration of a movement of a reference point Z in a sequence and movements of peak values of three ordered points. As an example, an algorithm of the three point cycle counting method is executed as follows.

In step S400, the computer reads a first peak value and sets the reference point Z of the sequence to the first peak value. That is, the computer reads the point a and sets the reference point Z to the point a (Z=a).

In step S410, the computer reads a next peak value. That is, the computer reads the point b.

In step S420, the computer determines whether there is a lack of data. At this point in time, there is no lack of data (No), and thus the computer causes processing to proceed to step S430.

In step S430, the computer determines whether the number of the read peak values of the points is less than three. At this point in time, the read peak values are of the two points which are the point a and the point b and which are less than three points (Yes), and thus the computer returns the processing to step S410.

In step S410, the computer reads a next peak value. That is, the computer reads the point c. In step S420, the computer determines whether there is a lack of data. At this point in time, there is no lack of data (No), and thus the computer causes the processing to proceed to step S430. In step S430, the computer determines whether the number of the read peak values of the points is less than three. At this point in time, the read peak values are of the three points which are the point a, the point b, and the point c and which are not less than three points (No), and thus the computer causes the processing to proceed to step S440.

In step S440, the computer sets a subset X and a subset Y by using latest three peak values among the read peak values. At this point in time, the computer sets, as the subset Y, the first oldest point a and the second oldest point b among the latest three peak values in this order (Y=ab). In addition, the computer sets, as the subset X, the second oldest point b and a third oldest point c among the latest three peak values in this order (X=bc).

In step S450, the computer determines whether an amplitude r (Y) is greater than an amplitude r (X). Here, the amplitude r (Y) indicates an absolute value between the two points included in the subset Y. Similarly, the amplitude r (X) indicates an absolute value between two points included in the subset X. At this point in time, the amplitude r (Y)=|point a−point b|=|−2−1|=3, and the amplitude r (X)=|point b−point c|=|1−(−3)|=4, and r (X)<r (Y) is not established (No), and thus the computer causes the processing to proceed to step S460.

In step S460, the computer determines whether the subset Y includes the reference point Z. At this point in time, Y=ab and Z=a, and the subset Y includes the reference point Z (Yes), and thus the computer causes the processing to proceed to step S470.

In step S470, the computer counts the amplitude r (Y) as 0.5 cycles. Further, the computer discards the first peak value of the subset Y. Further, the computer sets the reference point Z of the sequence to the second peak value of the subset Y (Z=b). At this point in time, Y=ab, and thus the computer counts the amplitude r (Y)=3 as 0.5 cycles. Further, the computer discards the point a. Further, the computer sets the reference point Z to the point b (Z=b). Further, the computer returns the processing to step S420.

In step S420, there is no lack of data (No), and thus the computer causes the processing to proceed to step S430. In step S430, the read peak values are of the two points which are the point b and the point c and which are less than three points (Yes), and thus the computer returns the processing to step S410. In step S410, the computer reads the point d. In step S420, there is no lack of data (No), and thus the computer causes the processing to proceed to step S430. In step S430, the read peak values are of the three points which are the point b, the point c, and the point d and which are not less than three points (No), and thus the computer causes the processing to proceed to step S440. In step S440, the computer sets, as the subset Y, the point b and the point c in this order (Y=bc), and sets, as the subset X, the point c and the point d in this order (X=cd). In step S450, the amplitude r (Y)=|point b−point c|=|1−(−3)|=4, and the amplitude r (X)=|point c−point d|=|(−3)−5|=8, and r (X)<r (Y) is not established (No), and thus the computer causes the processing to proceed to step S460. In step S460, Y=bc and Z=b, and the subset Y includes the reference point Z (Yes), and thus the computer causes the processing to proceed to step S470. In step S470, the computer counts the amplitude r (Y)=4 as 0.5 cycles, discards the point b, and sets the reference point Z to the point c (Z=c). Further, the computer returns the processing to step S420.

In step S420, there is no lack of data (No), and thus the computer causes the processing to proceed to step S430. In step S430, the read peak values are of the two points which are the point c and the point d and which are less than three points (Yes), and thus the computer returns the processing to step S410. In step S410, the computer reads the point e. In step S420, there is no lack of data (No), and thus the computer causes the processing to proceed to step S430. In step S430, the read peak values are of the three points which are the point c, the point d, and the point e and which are not less than three points (No), and thus the computer causes the processing to proceed to step S440. In step S440, the computer sets, as the subset Y, the point c and the point d in this order (Y=cd), and sets, as the subset X, the point d and the point e in this order (X=de). In step S450, the amplitude r (Y)=|point c−point d|=|(−3)−5|=8, and the amplitude r (X)=|point d-point e|=|5−(−1)|=6, and r (X)<r (Y) is established (Yes), and thus the computer returns the processing to step S410.

In step S410, the computer reads the point f. In step S420, there is no lack of data (No), and thus the computer causes the processing to proceed to step S430. In step S430, the read peak values are of the four points which are the point c, the point d, the point e, and the point f and which are not less than three points (No), and thus the computer causes the processing to proceed to step S440. In step S440, the computer sets, as the subset Y, the point d and the point e in this order (Y=de), and sets, as the subset X, the point e and the point f in this order (X=ef). In step S450, the amplitude r (Y)=|point d−point e|=|5−(−1)|=6, and the amplitude r (X)=|point e−point f|=|−1−3|=4, and r (X)<r (Y) is established (Yes), and thus the computer returns the processing to step S410.

In step S410, the computer reads the point g. In step S420, there is no lack of data (No), and thus the computer causes the processing to proceed to step S430. In step S430, the read peak values are of the five points which are the point c, the point d, the point e, the point f, and the point g and which are not less than three points (No), and thus the computer causes the processing to proceed to step S440. In step S440, the computer sets, as the subset Y, the point e and the point f in this order (Y=ef), and sets, as the subset X, the point f and the point g in this order (X=fg). In step S450, the amplitude r (Y)=|point e−point f|=|−1−3|=4, and the amplitude r (X)=|point f−point g|=|3+4)|=7, and r (X)<r (Y) is not established (No), and thus the computer advances the process to step S460. In step S460, Y=ef and Z=c, and the subset Y does not include the reference point Z (No), and thus the computer causes the processing to proceed to step S480.

In step S480, the computer counts the amplitude r (Y) as one cycle. Further, the computer discards both of the peak values of the subset Y. At this point in time, Y=ef, and thus the computer counts the amplitude r (Y)=4 as one cycle. Further, the computer discards the point e and the point f. Further, the computer returns the processing to step S420.

In step S420, there is no lack of data (No), and thus the computer causes the processing to proceed to step S430. In step S430, the read peak values are of the three points which are the point c, the point d, and the point g and which are not less than three points (No), and thus the computer causes the processing to proceed to step S440. In step S440, the computer sets, as the subset Y, the point c and the point d in this order (Y=cd), and sets, as the subset X, the point d and the point g in this order (X=dg). In step S450, the amplitude r (Y)=|point c−point d|=|−3−5|=8, and the amplitude r (X)=|point d−point g|=|5−(−4)|=9, and r (X)<r (Y) is not established (No), and thus the computer causes the processing to proceed to step S460. In step S460, Y=cd and Z=c, and the subset Y includes the reference point Z (Yes), and thus the computer causes the processing to proceed to step S470. In step S470, the computer counts the amplitude r (Y)=8 as 0.5 cycles, discards the point c, and sets the reference point Z to the point d (Z=d). Further, the computer returns the processing to step S420. In step S420, there is a lack of data (Yes), the computer causes processing to proceed to step S490.

In step S490, the computer counts each remaining amplitude as 0.5 cycles. At this point in time, the point d and the point g remain, the computer counts, as 0.5 cycles, the amplitude=9 between the point d and the point g. Then, the computer ends this flow.

By using the three point cycle counting method in this way, the computer can sequentially count the amplitude=3 as 0.5 cycles, the amplitude=4 as 0.5 cycles, the amplitude=4 as one cycle, the amplitude=8 to 0.5 cycles, and the amplitude=9 as 0.5 cycles. The diagnostic apparatus 200 according to the present embodiment use such a three point cycle counting method to calculate the amplitude of the peak value and the frequency of occurrence of the amplitude.

Figure 5:
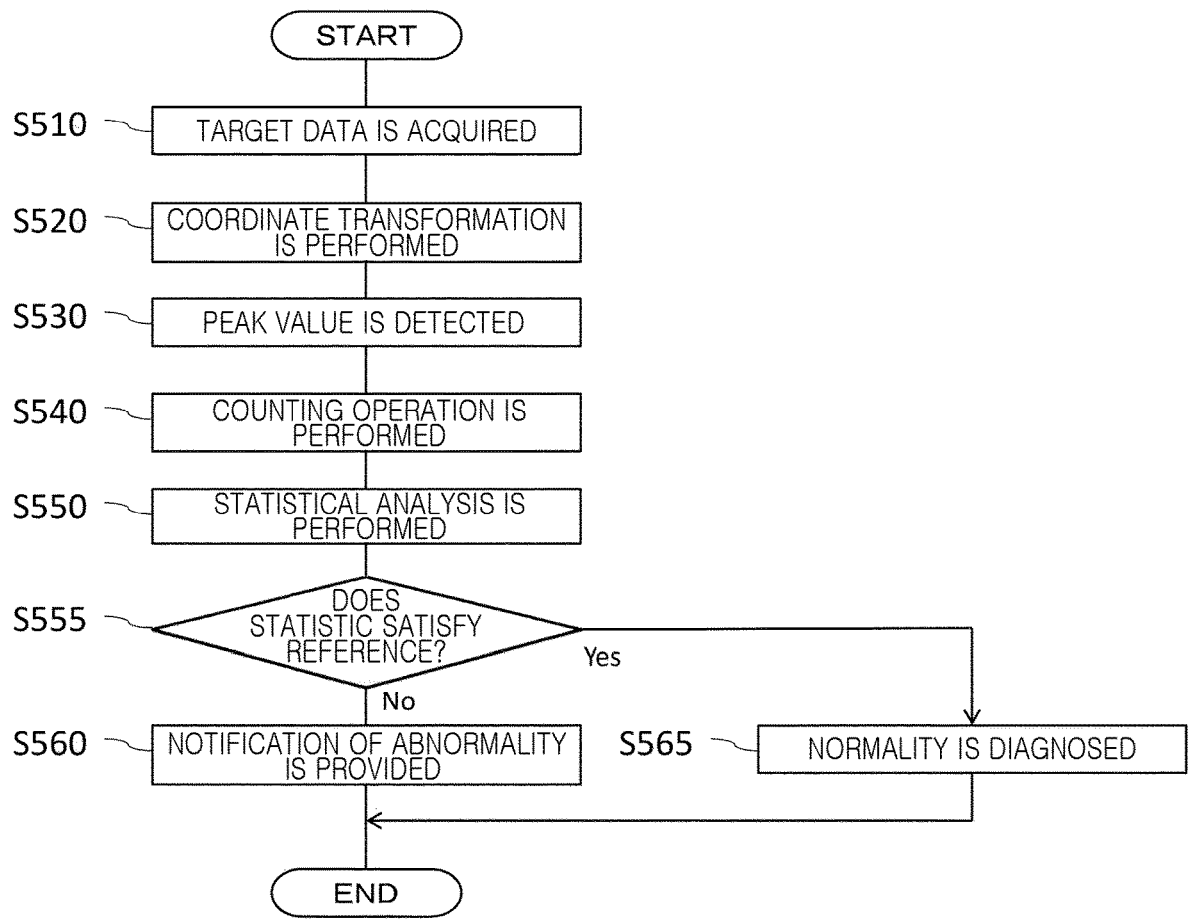
FIG. 5 shows an example of a flow in which the diagnostic apparatus 200 according to the present embodiment diagnoses an abnormality of the motor 20.

FIG. 5 shows an example of a flow in which the diagnostic apparatus 200 according to the present embodiment diagnoses an abnormality of the motor 20. The diagnostic apparatus 200 according to the present embodiment diagnoses, for example, the abnormality of the motor 20 by this flow.

In step S510, the diagnostic apparatus 200 acquires the target data. For example, the data acquisition unit 210 acquires the target data relating to the current value between the power conversion apparatus 100 and the motor 20, from the power conversion apparatus 100 via the network. As an example, the data acquisition unit 210 may acquire, as the target data, each of the digital values obtained by the AD converter digitally converting the motor currents which are respectively supplied from the first output point U, the second output point V, and the third output point W to the excitation windings for the three phases of the motor 20, and which are detected by the current sensor in the sensor unit 140. The data acquisition unit 210 supplies the acquired target data to the transformation unit 220.

In step S520, the diagnostic apparatus 200 performs the coordinate transformation of the target data. For example, in step S510, the transformation unit 220 performs the coordinate transformation of the acquired target data. As an example, for the motor current for the three phases acquired in step S510, the transformation unit 220 may rotate the dq coordinates in synchronization with a rotating magnetic field to apply the dq transformation. In this way, the coordinate transformation may be, for example, the dq transformation. The transformation unit 220 supplies the detection unit 230 with the target data of which the coordinate transformation is performed.

In step S530, the diagnostic apparatus 200 detects the peak value. For example, the detection unit 230 detects the peak value in the time series waveform of the target data. As an example, the detection unit 230 compares, with a previous value, a present value of the digital value in the target data of which the coordinate transformation is performed in step S520. Further, in a difference result obtained by subtracting the previous value from the present value, by setting a point, where a sign of the difference result is reversed from positive to negative, as the peak, and setting a point, where the sign is reversed from negative to positive, as the valley, the detection unit 230 detects the peak value. In this way, the detection unit 230 is configured to detect the peak value in the time series waveform of the target data of which the coordinate transformation is performed in step S520. The detection unit 230 supplies the detected peak value to the counting operation unit 240.

In step S540, the diagnostic apparatus 200 performs a counting operation. For example, the counting operation unit 240 uses the frequency counting method to calculate the amplitude of the peak value and the frequency of occurrence of the amplitude which are detected in step S530. As an example, the counting operation unit 240 may use the three point cycle counting method by the flow which is shown in FIG. 4 to calculate the amplitude of the peak value and the frequency of occurrence of the amplitude. However, as described above, the counting operation unit 240 may use other frequency counting methods, such as the peak method, the range method, and the range pair method, to calculate the amplitude of the peak value and the frequency of occurrence of the amplitude. The counting operation unit 240 supplies the diagnostic unit 250 with the amplitude of the peak value and the frequency of occurrence of the amplitude which are calculated.

In step S550, the diagnostic apparatus 200 performs a statistical analysis. For example, the diagnostic unit 250 performs the statistical analysis of the amplitude of the peak value and the frequency of occurrence of the amplitude which are calculated in step S540, and calculates the statistic such as an average, a variance, and a median of counted amplitudes.

In step S555, the diagnostic apparatus 200 determines whether the statistic satisfies a predetermined reference. For example, the diagnostic unit 250 compares the statistic calculated in step S550 with a predetermined threshold value. Then, when the statistic exceeds a predetermined threshold value, that is, does not satisfy a predetermined reference (in a case of No), the diagnostic unit 250 determines that the abnormality has occurred in the motor 20. This is because when the abnormality such as a deterioration or a failure occurs in the motor 20, an abnormal current flows, the abnormal current not flowing under a normal condition, and an amplitude of a peak value which deviates from statistics is generated. Therefore, the diagnostic unit 250 analyzes the amplitude of the peak value and the frequency of occurrence of the amplitude to calculate the statistic in time series, and when the statistic does not satisfy a predetermined reference, the diagnostic unit 250 diagnoses that some abnormality has occurred in the motor 20. In this way, the diagnostic unit 250 is configured to diagnose that the motor 20 is abnormal when the statistic which is calculated from the amplitude and the frequency of occurrence of the amplitude does not satisfy a predetermined reference.

It should be noted that in the above description, the case where the diagnostic unit 250 compares the absolute amount of the calculated statistic (the statistic itself) with a predetermined threshold value is shown as an example. However, instead of or in addition to this, the diagnostic unit 250 may compare, with a predetermined reference, an amount of change between the present value and the previous value of the calculated statistic. That is, the diagnostic unit 250 may diagnose that the motor 20 is abnormal when a magnitude of a change in the statistic which is calculated from the amplitude and the frequency of occurrence of the amplitude does not satisfy a predetermined reference. At this time, in a case where at least any one of the absolute amount and the amount of the change in the statistic does not satisfy the reference, the diagnostic unit 250 may diagnose that the motor 20 is abnormal, and in a case where both of the absolute amount and the amount of the change in the statistic do not satisfy references, the diagnostic unit 250 may diagnose that the motor 20 is abnormal. When the diagnostic apparatus 200 diagnoses that the motor 20 is abnormal, the processing proceeds to step S560.

In step S560, the diagnostic apparatus 200 provides the notification of the abnormality of the motor 20. For example, when the motor 20 is diagnosed to be abnormal, the notification unit 260 provides the notification of the abnormality by displaying, on the monitor, the fact that the motor 20 is abnormal. In addition, the notification unit 260 may transmit a signal indicating abnormal data by RS485, Ethernet (registered trademark), or the like to another functional unit or another apparatus. At this time, the notification unit 260 may output, as an electrical signal, a voltage or current signal from a digital output terminal or the like.

On the other hand, in step S555, when the statistic does not exceed a predetermined threshold value, that is, satisfies a predetermined reference (in a case of Yes), the diagnostic unit 250 determines that the abnormality has not occurred in the motor 20. When the diagnostic apparatus 200 diagnoses that the motor 20 is not abnormal, the processing proceeds to step S565.

In step S565, the diagnostic apparatus 200 provides the diagnosis of a fact that the motor 20 is normal. At this time, the diagnostic apparatus 200 may end the flow without executing special processing, or may execute a notification processing of the fact that the motor 20 is normal. In this case, when the motor 20 is diagnosed to be normal, the notification unit 260 may provide the notification of normality by displaying, on the monitor, the fact that the motor 20 is normal. For example, in this way, the diagnostic apparatus 200 according to the present embodiment diagnoses the abnormality of the motor 20.

Figure 6:
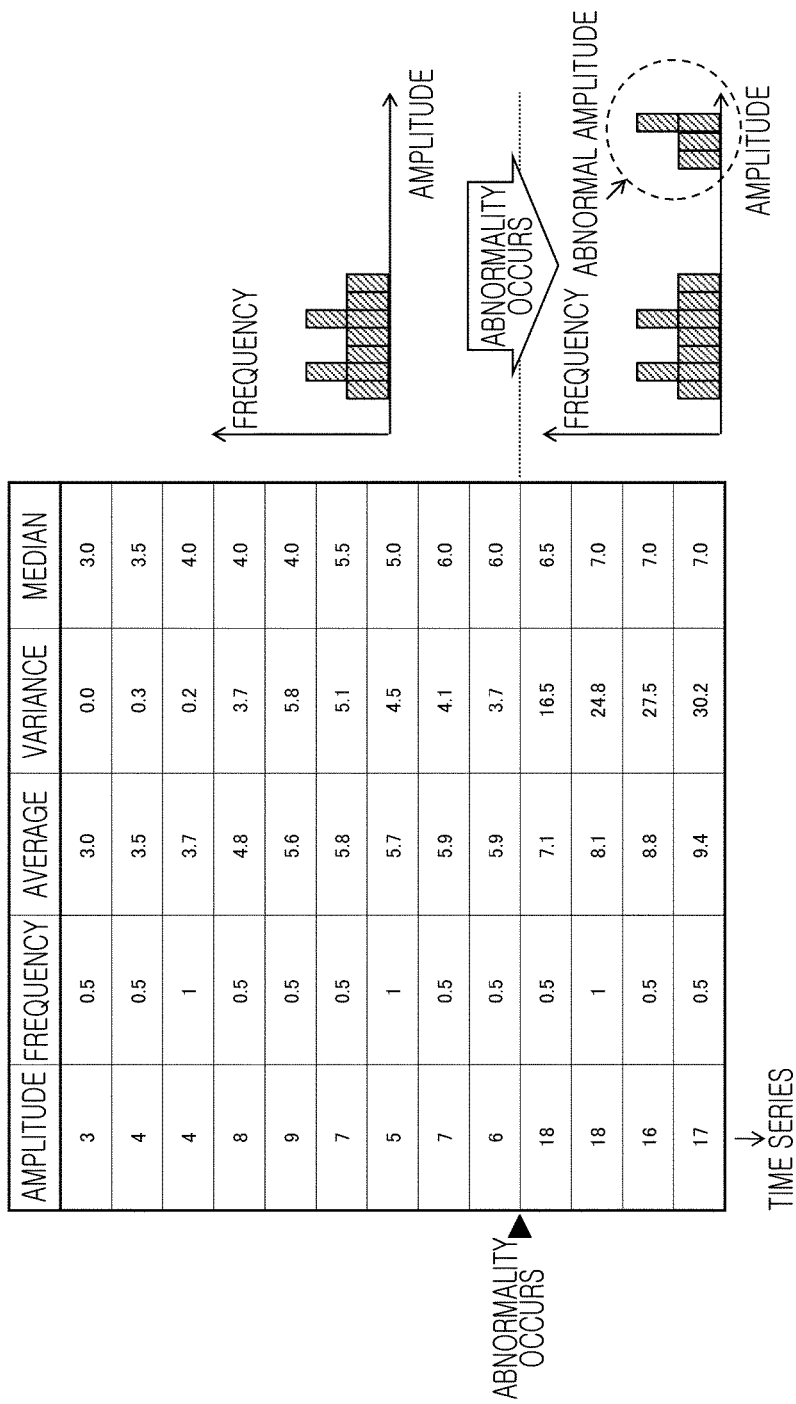
FIG. 6 shows an example of an amplitude, a frequency, and a statistic calculated by the diagnostic apparatus 200 according to the present embodiment.

FIG. 6 shows an example of an amplitude, a frequency, and a statistic calculated by the diagnostic apparatus 200 according to the present embodiment. The present drawing shows, as an example, a case where the diagnostic apparatus 200 sequentially counts the amplitudes=3, 4, 4, 8, 9, 7, 5, 7, 6, 18, 18, 16, 17. Each time the diagnostic apparatus 200 counts the amplitude, the diagnostic apparatus 200 calculates a statistic of the amplitudes counted so far. In this case, the diagnostic apparatus 200 may treat the amplitude counted as 0.5 cycles and the amplitude counted as one cycle, as a similar frequency. That is, the diagnostic apparatus 200 may calculate the statistic by regarding the amplitude counted as 0.5 cycles, as the amplitude counted as one cycle. However, the present invention is not limited to this. The diagnostic apparatus 200 may treat the amplitude according to the calculated frequency, that is, as the number of times of the amplitude counted as one cycle is twice that of the amplitude counted as 0.5 cycles.

The present drawing shows, as an example, a case where the diagnostic apparatus 200 calculates the average, the variance, and the median of the amplitudes, as the statistic. As shown in the present drawing, before the abnormality occurs, the amplitude is counted in a range of 3 to 9. On the other hand, after the occurrence of the abnormality, abnormal amplitudes, which are from 16 to 18 and deviate from statistics before the occurrence of the abnormality, occur. The diagnostic apparatus 200 according to the present embodiment detects the occurrence of the abnormality of the motor 20 from the calculated statistic.

As an example, when the calculated average exceeds a predetermined threshold value (for example, 7), the diagnostic unit 250 may diagnose that the abnormality has occurred in the motor 20. Instead of or in addition to this, when the calculated variance exceeds a predetermined threshold value (for example, 10), the diagnostic unit 250 may also diagnose that the abnormality has occurred in the motor 20. Instead of or in addition to this, when the calculated median exceeds a predetermined threshold value (for example, 7), the diagnostic unit 250 may also diagnose that the abnormality has occurred in the motor 20. In this way, the diagnostic unit 250 may diagnose that the motor 20 is abnormal when the statistic which is calculated from the amplitude and the frequency of occurrence of the amplitude does not satisfy a predetermined reference. It should be noted that in a case of calculating multiple statistics, when at least one statistic does not satisfy a predetermined reference, the diagnostic unit 250 may diagnose that the motor 20 is abnormal, and when all of the multiple statistics do not satisfy a predetermined reference, the diagnostic unit 250 may diagnose that the motor 20 is abnormal. In addition, the diagnostic unit 250 may score a result of comparing each statistic with the threshold value, and diagnose that the motor 20 is abnormal when a total of the scores does not satisfy a predetermined reference.

Instead of or in addition to this, when the amount of the change between the present value and the previous value of the calculated average exceeds a predetermined threshold value (for example, 1.1), the diagnostic unit 250 may also diagnose that the abnormality has occurred in the motor 20. Instead of or in addition to this, when the amount of the change between the present value and the previous value of the calculated variance exceeds a predetermined threshold value (for example, 10), the diagnostic unit 250 may also diagnose that the abnormality has occurred in the motor 20. That is, the diagnostic unit 250 may diagnose that the motor 20 is abnormal when the magnitude of the change in the statistic which is calculated from the amplitude and the frequency of occurrence of the amplitude does not satisfy a predetermined reference. In this way, the diagnostic apparatus 200 can diagnose the abnormality of the motor 20.

In general, the power conversion apparatus and the motor are widely used in industry. Such a power conversion apparatus and a motor are used not only for a single operation application of a fan, a pump, or the like, but also in combination with another power conversion apparatus, a PLC (Programmable Logic Controller), a motion controller, and various sensor devices as parts of a variety of machine tools, robots, manufacturing apparatuses, transportation apparatuses, and the like.

The motor which is applied to such an apparatus is, for a stable operation, a target of important maintenance and inspection at a maintenance site. The maintenance and inspection includes a daily inspection which is performed every day, a regular inspection which is performed once every few months, an overhaul which is performed once every few years, and the like, and there are a wide variety of inspection items. However, as there are many motors that are required to operate continuously for 24 hours, it is difficult to systematically perform the inspection once every few months for a serious labor shortage and a technician shortage at the maintenance site. In particular, regarding a measurement of an insulation resistance (a ground fault) between a stator winding and the ground, or an insulation resistance (the layer short) between respective phases, which is one of periodic inspection items, it is typical to temporarily stop the motor and measure the insulation resistance, which is one of factors that make a planned inspection more difficult. Therefore, there is an increasing need for CBM (Condition Base Maintenance) for carrying out the inspection based on a condition of the device, rather than an inspection period being regulated. Therefore, it is required to constantly diagnose a failure and a trouble of the power conversion apparatus or the motor, and catch a change or a sign. For this reason, an apparatus and a method for diagnosing factory equipment and the like have begun to be proposed.

Against such a background, Patent Document 1 proposes a method for performing an abnormality diagnosis of a motor by performing a three-phase to two-phase conversion of an output current to calculate a current vector, and extracting a waveform in a specific frequency range based on the current vector. In addition, Patent Document 2 proposes a method for detecting four different types of abnormalities by measuring a zero-phase current, a phase current, and a phase voltage. In particular, in Patent Document 2, regarding a bearing defect, a component of output frequency ±20 Hz is cut out from a phase current by using a bandpass filter, and an abnormality diagnosis is performed by the comparison with a reference value in a frequency band excluding an output frequency.

In this way, in the methods of Patent Document 1 and Patent Document 2, it is necessary to apply a filter to extract a signal in a specific frequency band. In addition, it is also conceivable to carry out a spectral analysis such as a fast Fourier transform (FFT) to extract a signal in a specific frequency band; however, in this case, a resource of a control microcomputer is encumbered, and it is necessary to add expensive measuring equipment or implement a microcomputer with high performance.

In contrast with this, the diagnostic apparatus 200 according to the present embodiment focuses on the amplitude of the detected current value, and diagnoses the abnormality of the motor 20 by the analysis using the frequency counting method. Thereby, with the diagnostic apparatus 200 according to the present embodiment, the spectral analysis such as the FFT having a large load of filtering and calculating is unnecessary, and it is possible to diagnose the motor 20 at a lower cost and without encumbering the resource of the control microcomputer.

In addition, the diagnostic apparatus 200 according to the present embodiment is configured to diagnose that the motor 20 is abnormal when the statistic which is calculated from the amplitude and the frequency of occurrence of the amplitude does not satisfy a predetermined reference. Thereby, with the diagnostic apparatus 200 according to the present embodiment, it is possible to diagnose the abnormality of the motor 20 in consideration of a degree of a deviation from a distribution of previously counted amplitudes, rather than diagnose the abnormality of the motor 20 based on the value itself of the counted amplitude. At this time, the diagnostic apparatus 200 according to the present embodiment diagnoses the abnormality of the motor 20 also in consideration of the amount of change in the statistic other than the absolute amount of the calculated statistic. Thereby, with the diagnostic apparatus 200 according to the present embodiment, it is possible to diagnose that the motor 20 is abnormal when the amplitude, which greatly changes the statistic so far, is counted.

In addition, the diagnostic apparatus 200 according to the present embodiment is configured to provide the notification of the abnormality when the motor 20 is diagnosed to be abnormal. Thereby, with the diagnostic apparatus 200 according to the present embodiment, it is possible to notify the fact that the abnormality has occurred in the motor 20, and thus, for example, it is possible to provide a trigger for separating the failure or the trouble by an operator performing a detailed analysis.

In addition, the diagnostic apparatus 200 according to the present embodiment performs the coordinate transformation of the target data prior to detecting the peak value in the time series waveform of the target data. Thereby, with the diagnostic apparatus 200 according to the present embodiment, it is possible to simplify the subsequent analysis. In particular, in a case where such a coordinate transformation is the dq transformation, when viewed from the dq coordinates that rotate in synchronization with the rotating magnetic field, a space vector of a fundamental wave voltage and current appears to be stationary (a direct current), and thus it is possible to simplify the analysis.

Figure 7:
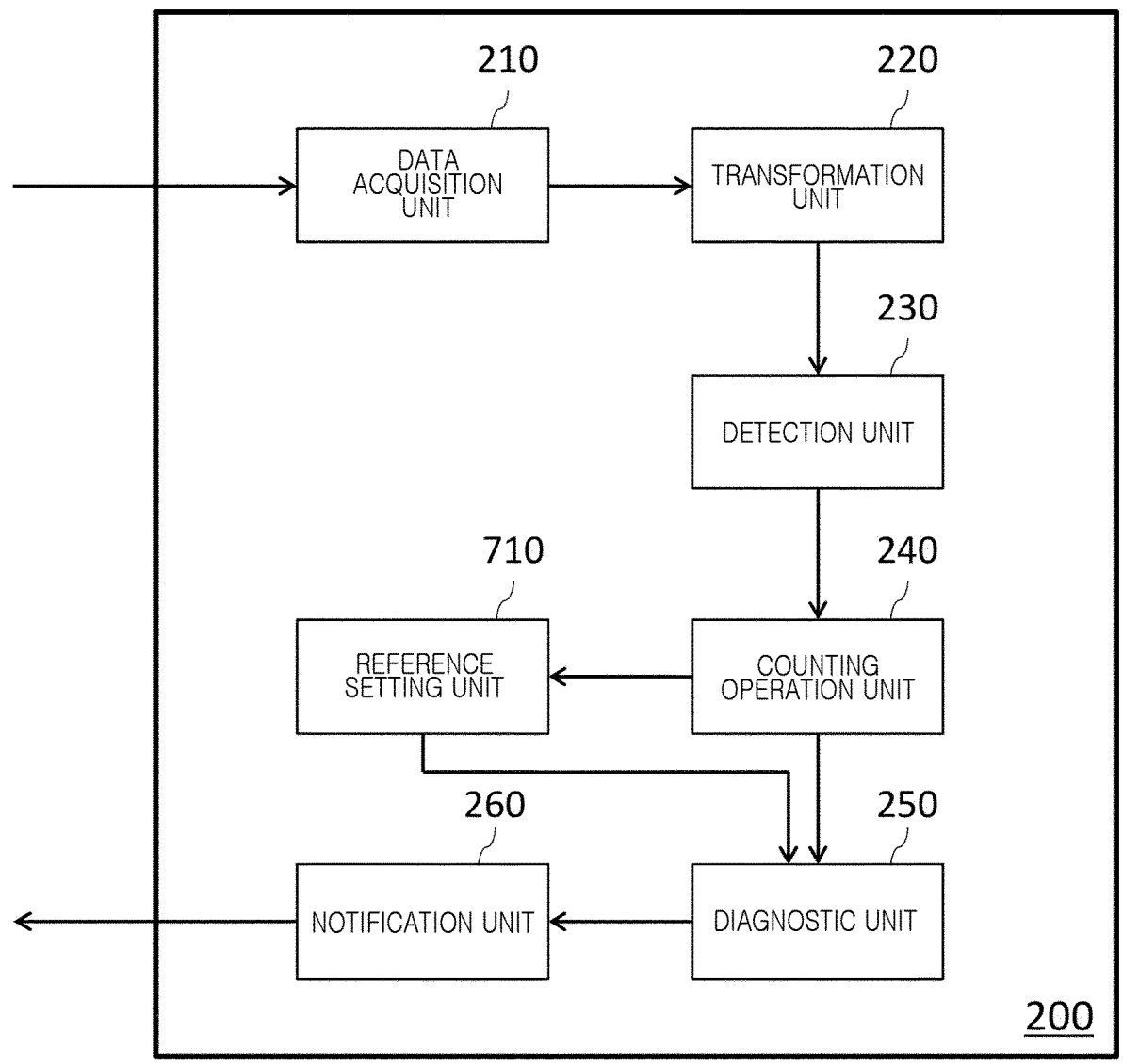
FIG. 7 shows an example of a block diagram of the diagnostic apparatus 200 according to a modification example of the present embodiment.

FIG. 7 shows an example of a block diagram of the diagnostic apparatus 200 according to a modification example of the present embodiment. In FIG. 7, the same signs and numerals are given to members having the same functions and configurations as those in FIG. 2, and the descriptions will be omitted except for the following differences. The diagnostic apparatus 200 according to the present modification example further automatically sets a diagnostic reference for diagnosing the abnormality of the motor 20. The diagnostic apparatus 200 according to the present modification example further includes a reference setting unit 710. In the diagnostic apparatus 200 according to the present modification example, the counting operation unit 240 supplies the reference setting unit 710 with the amplitude of the peak value and the frequency of occurrence of the amplitude which are calculated for a predetermined period (a learning period).

The reference setting unit 710 is configured to set the reference based on the amplitude and the frequency of occurrence of the amplitude which are calculated for a predetermined period. For example, the reference setting unit 710 statistically analyzes the amplitude of the peak value and the frequency of occurrence of the amplitude which are calculated during approximately several weeks of a normal drive after the control of the motor 20 is started, and performs machine learning by using the statistic for the period as training data. This makes the reference setting unit 710 set the reference (for example, the threshold value) for classifying the normality and the abnormality of the motor 20. The reference setting unit 710 supplies the set reference to the diagnostic unit 250.

In a diagnostic phase, the diagnostic unit 250 compares the calculated statistic with the reference set by the reference setting unit 710, and diagnoses the abnormality of the motor 20 from a comparison result.

In this way, the diagnostic apparatus 200 according to the present modification example automatically sets the diagnostic reference for diagnosing the abnormality of the motor 20. Thereby, with the diagnostic apparatus 200 according to the present modification example, it is possible for a user to omit a trouble of setting the diagnostic reference, and it is also possible to set an appropriate diagnostic reference based on data calculated for a normal period.

In addition, the embodiment above described may be changed or applied in various ways. For example, in the above description, the case where the diagnostic apparatus 200 diagnoses the abnormality of the motor 20 only based on the motor current is shown as an example. However, the diagnostic apparatus 200 may further acquire, in addition to the motor current, data relating to other parameters, as the target data, and diagnose the abnormality of the motor 20 based on the target data. Typically, power consumption [W], which is an important operation index of the motor 20, is calculated by a product of the voltage and the current. Accordingly, the data acquisition unit 210 may acquire, in addition to the current value, data relating to a voltage value between the power conversion apparatus 100 and the motor 20, as the target data. At this time, the data acquisition unit 210 may acquire, for example, data relating to a three-phase PWM voltage between the power conversion apparatus 100 and the motor 20. In this case, the data acquisition unit 210 may acquire a line voltage or the phase voltage, or may acquire the line voltage for a conversion into the phase voltage. In addition, when acquiring the PWM voltage, the data acquisition unit 210 may acquire a value detected by a $\Delta\Sigma$ modulator or a filtered value as the target data. It should be noted that in a case where the power conversion apparatus 100 outputs a sine wave, the data acquisition unit 210 may acquire the detected voltage as is.

In addition, typically, an example of the important operation index of the motor 20 includes the rotation speed. Accordingly, the data acquisition unit 210 may acquire, in addition to the current value, data relating to the rotation speed and the torque of the motor 20, as the target data. It should be noted that the data relating to the voltage value and the rotation speed may be data directly detected by the sensor or the like, or may be data estimated from other parameters by a calculation.

In addition, in the above description, the case where one diagnostic apparatus 200 diagnoses the abnormality of one motor 20 from the target data between one power conversion apparatus 100 and the one motor 20 is shown as an example; however, the present invention is not limited to this. One diagnostic apparatus 200 may diagnose the abnormality of each motor 20 from the target data in each of a plurality of power conversion apparatuses 100 and each of a plurality of motors 20. In this case, the diagnostic apparatus 200 may aggregate diagnostic results for the respective motors 20 to summarize the aggregated diagnostic results as a diagnostic result.

In addition, in the above description, the case where the diagnostic apparatus 200 and the power conversion apparatus 100 are separate apparatuses which are independent of each other is described as an example, but the present invention is not limited to this. The diagnostic apparatus 200 according to the present embodiment may be built in the power conversion apparatus 100 to be realized as an integrated apparatus. In the case of being built in the power conversion apparatus 100, the function may be realized by the control circuit 150. For example, the motor current acquired by the sensor unit 140 is transmitted to the control circuit 150, and in a vector control of the inverter circuit such as the coordinate transformation of the received motor current which is performed for the comparison with a current command value, the control circuit 150 may cause the data acquisition unit 210 and the transformation unit 220 to be realized to have a function in common with the vector control. In addition, the function of the diagnostic apparatus 200 after the detection unit 230 may be realized in the control circuit 150, or may be separately realized in a different circuit.

Various embodiments of the present invention may be described with reference to flowcharts and block diagrams whose blocks may represent (1) steps of processes in which operations are executed or (2) sections of apparatuses responsible for executing operations. Certain steps and sections may be implemented by dedicated circuitry, programmable circuitry supplied with computer-readable instructions stored on computer-readable media, and/or processors supplied with computer-readable instructions stored on computer-readable media. Dedicated circuitry may include digital and/or analog hardware circuits, and may include integrated circuits (IC) and/or discrete circuits. Programmable circuitry may include reconfigurable hardware circuits comprising logical AND, OR, XOR, NAND, NOR, and other logical operations, flip-flops, registers, memory elements, etc., such as field-programmable gate arrays (FPGA), programmable logic arrays (PLA), and the like.

A computer-readable medium may include any tangible device that can store instructions to be executed by a suitable device, and as a result, the computer-readable medium having instructions stored in the tangible device comprises an article of manufacture including instructions which can be executed to create means for executing operations specified in the flowcharts or block diagrams. Examples of the computer-readable medium may include an electronic storage medium, a magnetic storage medium, an optical storage medium, an electromagnetic storage medium, a semiconductor storage medium, etc. Specific examples of the computer-readable medium may include a floppy (registered trademark) disk, a diskette, a hard disk, a random access memory (RAM), a read-only memory (ROM), an erasable programmable read-only memory (EPROM or Flash memory (registered trademark)), an electrically erasable programmable read-only memory (EEPROM), a static random access memory (SRAM), a portable compact disc read-only memory (CD-ROM), a digital versatile disc (DVD), a Blu-ray (registered trademark) disc, a memory stick, an integrated circuit card, or the like.

The computer-readable instructions may include assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk (registered trademark), JAVA (registered trademark), C++ or the like, and conventional procedural programming languages, such as the "C" programming language or similar programming languages.

Computer-readable instructions may be provided to a processor of a general-purpose computer, special purpose computer, or other programmable data processing apparatus, or to programmable circuitry, locally or via a local area network (LAN), wide area network (WAN) such as the Internet, etc., so that the computer-readable instructions are executed to create means for executing operations specified in the flowcharts or block diagrams. Examples of the processor include a computer processor, a processing unit, a microprocessor, a digital signal processor, a controller, a microcontroller, and the like.

Figure 8:
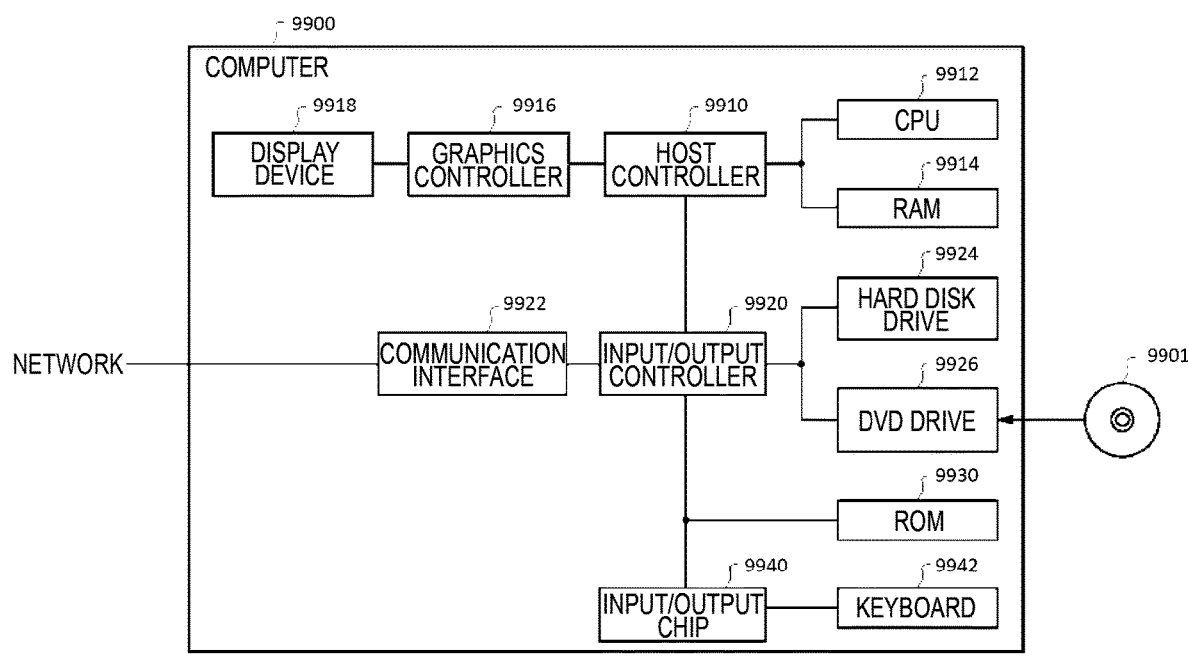
FIG. 8 shows an example of a computer 9900 in which a plurality of aspects of the present invention may be entirely or partially embodied.

FIG. 8 shows an example of a computer 9900 in which a plurality of aspects of the present invention may be entirely or partially embodied. A program that is installed in the computer 9900 can cause the computer 9900 to function as operations associated with apparatuses according to the embodiments of the present invention or one or more sections of the apparatuses, or can cause the computer 9900 to execute the operations or the one or more sections thereof, and/or can cause the computer 9900 to execute processes according to the embodiments of the present invention or steps of the processes. Such a program may be executed by a CPU 9912 to cause a computer 9900 to execute certain operations associated with some or all of the blocks of flowcharts and block diagrams described herein.

The computer 9900 according to the present embodiment includes the CPU 9912, a RAM 9914, a graphics controller 9916, and a display device 9918, which are interconnected by a host controller 9910. The computer 9900 also includes input/output units such as a communication interface 9922, a hard disk drive 9924, a DVD drive 9926, and an IC card drive, which are connected to the host controller 9910 via an input/output controller 9920. The computer also includes legacy input/output units such as a ROM 9930 and a keyboard 9942, which are connected to the input/output controller 9920 via an input/output chip 9940.

The CPU 9912 operates according to programs stored in the ROM 9930 and the RAM 9914, thereby controlling each unit. The graphics controller 9916 obtains image data generated by the CPU 9912 on a frame buffer or the like provided in the RAM 9914 or in the graphics controller 9916 itself, and causes the image data to be displayed on the display device 9918.

The communication interface 9922 communicates with other electronic devices via a network. The hard disk drive 9924 stores programs and data used by the CPU 9912 within the computer 9900. The DVD drive 9926 reads the programs or the data from a DVD-ROM 9901, and provides the hard disk drive 9924 with the programs or the data via the RAM 9914. The IC card drive reads the programs and the data from an IC card, and/or writes the programs and the data to the IC card.

The ROM 9930 stores, in itself, a boot program or the like that is executed by the computer 9900 during activation, and/or a program that depends on hardware of the computer 9900. The input/output chip 9940 may also connect various input/output units to the input/output controller 9920 via a parallel port, a serial port, a keyboard port, a mouse port, and the like.

A program is provided by the computer-readable medium such as the DVD-ROM 9901 or the IC card. The program is read from the computer-readable medium, installed in the hard disk drive 9924, the RAM 9914, or the ROM 9930, which is also an example of the computer-readable medium, and executed by the CPU 9912. The information processing written in these programs is read into the computer 9900, resulting in cooperation between a program and the above-mentioned various types of hardware resources. An apparatus or method may be constituted by realizing the operation or processing of information in accordance with the usage of the computer 9900.

For example, when a communication is executed between the computer 9900 and an external device, the CPU 9912 may execute a communication program loaded in the RAM 9914, and instruct the communication interface 9922 to process the communication based on the processing written in the communication program. The communication interface 9922, under control of the CPU 9912, reads transmission data stored on a transmission buffering region provided in a recording medium such as the RAM 9914, the hard disk drive 9924, the DVD-ROM 9901, or the IC card, and transmits the read transmission data to a network or writes reception data received from a network to a reception buffering region or the like provided on the recording medium.

In addition, the CPU 9912 may cause all or a necessary portion of a file or a database to be read into the RAM 9914, the file or the database having been stored in an external recording medium such as the hard disk drive 9924, the DVD drive 9926 (the DVD-ROM 9901), the IC card, etc., and execute various types of processing on the data on the RAM 9914. The CPU 9912 then writes back the processed data to the external recording medium.

Various types of information, such as various types of programs, data, tables, and databases, may be stored in the recording medium to undergo information processing. The CPU 9912 may execute various types of processing on the data read from the RAM 9914 to write back a result to the RAM 9914, the processing being described throughout the present disclosure, specified by instruction sequences of the programs, and including various types of operations, information processing, condition determinations, conditional branching, unconditional branching, information retrievals/replacements, or the like. In addition, the CPU 9912 may search for information in a file, a database, etc., in the recording medium. For example, when a plurality of entries, each having an attribute value of a first attribute associated with an attribute value of a second attribute, are stored in the recording medium, the CPU 9912 may search for an entry matching the condition whose attribute value of the first attribute is designated, from among the plurality of entries, and read the attribute value of the second attribute stored in the entry, thereby obtaining the attribute value of the second attribute associated with the first attribute satisfying the predetermined condition.

The above-described program or software modules may be stored in the computer-readable medium on the computer 9900 or near the computer 9900. In addition, a recording medium such as a hard disk or a RAM provided in a server system connected to a dedicated communication network or the Internet can be used as the computer-readable media, thereby providing the program to the computer 9900 via the network.

While the embodiments of the present invention have been described, the technical scope of the invention is not limited to the above-described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES 10 power supply
20 motor
100 power conversion apparatus
110 rectifier circuit
120 smoothing capacitor
130 inverter circuit
140 sensor unit
150 control circuit
160 drive circuit
200 diagnostic apparatus
210 data acquisition unit
220 transformation unit
230 detection unit
240 counting operation unit
250 diagnostic unit
260 notification unit
710 reference setting unit
9900 computer
9901 DVD-ROM
9910 host controller
9912 CPU
9914 RAM
9916 graphics controller
9918 display device
9920 input/output controller
9922 communication interface
9924 hard disk drive
9926 DVD drive
9930 ROM
9940 input/output chip
9942 keyboard

What is claimed is:

1. A diagnostic method comprising:
controlling a motor to rotate;
acquiring target data relating to a current value of electrical current between a power conversion apparatus and the motor;
detecting at least three latest peak values in a time series waveform of the target data;
using a frequency counting method to calculate an amplitude of each of the at least three latest peak values and a frequency of occurrence of the amplitude of each of the at least three latest peak values;
diagnosing an abnormality of the motor based on the calculated amplitude of the at least three latest peak values and the frequency of occurrence of the amplitude of the at least three latest peak values; and
stopping the rotation of the motor based on the diagnosed abnormality, wherein
the amplitude of each of the at least three latest peak values is an absolute value of a difference in amplitude between two adjacent ones of the at least three latest peak values, and
a weight of either 0.5 cycle or 1.0 cycle is assigned to each of the at least three latest peak values.

2. A non-transient recording medium having recorded thereon a diagnostic program that is executed by a computer and causes the computer to:
control a motor to rotate;
acquire target data relating to a current value between a power conversion apparatus and the motor;
detect at least three latest peak values in a time series waveform of the target data;
use a frequency counting method to calculate an amplitude of each of the at least three latest peak values and a frequency of occurrence of the amplitude of the at least three latest peak values;
diagnose an abnormality of the motor based on the calculated amplitude of the at least three latest peak values and the frequency of occurrence of the amplitude of the at least three latest peak values; and
stop the rotation of the motor based on the diagnosed abnormality, wherein
the amplitude of each of the at least three latest peak values is an absolute value of a difference in amplitude between two adjacent ones of the at least three latest peak values, and
a weight of either 0.5 cycle or 1.0 cycle is assigned to each of the at least three latest peak values.

3. The diagnostic method according to claim 1, further comprising:
diagnosing that the motor is abnormal when a statistic which is calculated from the amplitude and the frequency of occurrence does not satisfy a predetermined reference.

4. The diagnostic method according to claim 1, further comprising:
diagnosing that the motor is abnormal when a magnitude of a change in a statistic which is calculated from the amplitude and the frequency of occurrence does not satisfy a predetermined reference.

5. The diagnostic method according to claim 3, further comprising:
diagnosing that the motor is abnormal when a magnitude of a change in the statistic which is calculated from the amplitude and the frequency of occurrence does not satisfy a predetermined reference.

6. The diagnostic method according to claim 3, further comprising:
setting a reference based on an amplitude and a frequency of occurrence which are calculated for a predetermined period.

7. The diagnostic method according to claim 4, further comprising:
setting a reference based on an amplitude and a frequency of occurrence which are calculated for a predetermined period.

8. The diagnostic method according to claim 1, further comprising:
providing a notification of the abnormality when the motor is diagnosed to be abnormal.

9. The diagnostic method according to claim 3, further comprising:
providing a notification of the abnormality when the motor is diagnosed to be abnormal.

10. The diagnostic method according to claim 1, further comprising:
performing a coordinate transformation of the target data, wherein
the at least three peak values are detected in the time series waveform of the target data of which the coordinate transformation is performed.

11. The diagnostic method according to claim 3, further comprising:
performing a coordinate transformation of the target data, wherein the at least three peak values are detected in the time series waveform of the target data of which the coordinate transformation is performed.

12. The diagnostic method according to claim 10, wherein the coordinate transformation is a dq transformation.

13. The diagnostic method according to claim 1, further comprising
acquiring, in addition to the current value, data relating to a voltage value between the power conversion apparatus and the motor, as the target data.

14. The diagnostic method according to claim 3, further comprising
acquiring, in addition to the current value, data relating to a voltage value between the power conversion apparatus and the motor, as the target data.

15. The diagnostic method according to claim 1, further comprising
acquiring, in addition to the current value, data relating to a rotation speed of the motor, as the target data.

16. The diagnostic method according to claim 3, further comprising
acquiring, in addition to the current value, data relating to a rotation speed of the motor, as the target data.

17. A power conversion method comprising:
the diagnostic method according to claim 1.

18. A power conversion method comprising:
the diagnostic method according to claim 3.

19. A power conversion method comprising:
the diagnostic method according to claim 4.

* * * * *